(12) United States Patent
Peters

(10) Patent No.: US 12,148,599 B2
(45) Date of Patent: Nov. 19, 2024

(54) PLASMA CHAMBER FOR AN OPTICAL EMISSION SPECTROSCOPY INSTRUMENT

(71) Applicant: Hitachi High-Tech Analytical Science GmbH, Uedem (DE)

(72) Inventor: André Peters, Kleve-Warbeyen (DE)

(73) Assignee: HITACHI HIGH-TECH ANALYTICAL SCIENCE GMBH, Uedem (DE)

( * ) Notice: Subject to any disclaimer, the term of this patent is extended or adjusted under 35 U.S.C. 154(b) by 0 days.

(21) Appl. No.: 18/493,243

(22) Filed: Oct. 24, 2023

(65) Prior Publication Data

US 2024/0136163 A1  Apr. 25, 2024
US 2024/0234110 A9  Jul. 11, 2024

(30) Foreign Application Priority Data

Oct. 25, 2022  (EP) .................................... 22203570

(51) Int. Cl.
*H01J 37/32*   (2006.01)
(52) U.S. Cl.
CPC .. *H01J 37/32807* (2013.01); *H01J 37/32055* (2013.01); *H01J 37/32972* (2013.01)
(58) Field of Classification Search
CPC ........... H01J 37/32807; H01J 37/32055; H01J 37/32972
See application file for complete search history.

(56) References Cited

U.S. PATENT DOCUMENTS 6,468,642 B1 * 10/2002 Bray ....................... B26B 21/60
                                                  428/408
2021/0285820 A1   9/2021 Dominick et al.
2022/0155217 A1 * 5/2022 Lancuba ................. G01N 21/67

FOREIGN PATENT DOCUMENTS

CN   110965022 A   4/2020
EP    0856592 A1   8/1998

OTHER PUBLICATIONS

Feldman et al., Applications of diamond films and related materials NIST SP 885, NIST, National Institute of Standard and Technology, Dec. 31, 1995, pp. 1-984.
Shinji et al., Preparation of DLC films using microwave plasma CVD in open-air, 2017 International Symposium on Electrical Insulating Materials (ISEIM), Sep. 11, 2017, pp. 43-46, Technical Committee on Dielectrics & Electrical Insulation, IEEJ.
Search Report for EP22203570 mailed Mar. 10, 2023, 3 pages.

* cited by examiner

*Primary Examiner* — Mary Ellen Bowman
(74) *Attorney, Agent, or Firm* — NIXON & VANDERHYE

(57) ABSTRACT

According to an example, a spark stand assembly for an OES instrument is provided, the spark stand assembly including: a spark stand body that at least partially defines a plasma chamber; an exciter at least partially disposed inside the plasma chamber; and an optical transmission path from the plasma chamber for providing a view to a plasma generated in the plasma chamber, wherein the plasma chamber is provided with an opening for exposing a part of a sample positioned on the opening for excitation from the exciter so as to generate plasma on a surface of the sample upon activation of the exciter, and wherein a coating layer that includes a tribological coating is arranged to cover at least a portion of surfaces of the plasma chamber.

16 Claims, 6 Drawing Sheets

PLASMA CHAMBER FOR AN OPTICAL EMISSION SPECTROSCOPY INSTRUMENT

CROSS-REFERENCE TO RELATED APPLICATIONS

This application claims the priority under 35 USC 119(a) of EP patent application 22203570.1, filed on 25 Oct. 2022, the entirety of which is incorporated herein by reference.

TECHNICAL FIELD

The example and non-limiting embodiments of the present invention relate to optical emission spectroscopy instruments and, in particular, to a plasma chamber of such an instrument.

BACKGROUND

Analyzer instruments that are applicable for analysis of material such as metals at high accuracy typically rely on optical emission spectroscopy (OES) techniques. Analyzer instruments that rely on spark OES technique(s) find use in laboratories as well as in industry where accurate and reliable material analysis is important. High-performance spark OES instruments intended for professional industrial applications are complex apparatuses that are typically provided as desktop (or benchtop) devices or mobile devices provided with wheels or mounted on a wheeled trolley that is tailored for transporting the analyzer instrument.

A basic operating principle of an OES technique involves exciting a sample using a suitable excitation means in order to transform a fraction of the sample into a plasma state and transmitting light emitted from transitions between energy levels of excited atoms or ions of the plasma to a spectrometer for analysis of elemental composition of the sample via comparison of the captured sample spectrum to respective reference spectra of one or more samples of known elemental composition. Various means of excitation are known in the art, such as arc, spark, laser, inductively coupled plasma (ICP), direct-current plasma (DCP), where the type of excitation is in many cases applied to designate the respective OES technique, e.g. spark OES or laser-induced breakdown spectroscopy (LIBS).

Depending on the wavelength range to be covered by a detection and analysis system of an OES instrument, an ultraviolet (UV) transmissive atmosphere may be necessary at and/or near a spot of plasma generation and along a transmission path from the spot of plasma generation to the spectrometer interface. Such an atmosphere is typically provided by injecting inert gas such as argon, which facilitates plasma generation and prevents formation of undesired substances such as oxides, carbides and nitrides that are likely to form if generating plasma in ambient air.

Due to this requirement of specific atmosphere at and near the spot of plasma generation, an OES instrument typically includes a plasma chamber provided with an opening for exposing the spot of the sample placed against the opening for the excitation, whereas arranging the sample on the opening typically seals the plasma chamber in a gas-tight manner. The plasma chamber further includes excitation means for exciting the exposed spot of the sample, gas-inlet(s) to allow for injecting the inert gas into the plasma chamber to purge the spot of plasma generation and draining outlet(s) for removing the inert gas as well as any contamination and/or debris formed during plasma generation out of the plasma chamber. The plasma chamber is further provided with an (optical) window for transmitting light emitted from the plasma out of the plasma chamber and further to the spectrometer. In an OES instrument that makes use of the spark excitation (i.e. in a spark OES instrument) the plasma chamber may be also referred to as a spark chamber.

Typically, a major portion of inner surfaces of the plasma chamber are made of metal (such as stainless steel) to ensure durability and to facilitate cooling of the plasma chamber after generation of plasma therein. In this regard, the metallic portion(s) of the inner walls may be polished to make them as smooth as possible to avoid arc-overs within the plasma chamber and to facilitate efficient purging by the stream of inert gas. Moreover, the excitation means, which in case of an arc or spark OES instrument comprises an electrode, typically protrudes to the interior of the plasma chamber through an insulator that serves to prevent electrical connection between the excitation means and the metallic portion(s) of the inner surface of the plasma chamber, the insulator thereby forming part of the inner surface.

While a stream of inert gas applied for purging the plasma chamber is typically able to remove a majority of the contamination and/or debris from the plasma chamber, due to high temperatures involved in generation of the plasma some of the contamination may involve material deposited on the inner surfaces of the plasma chamber and/or on the optical window and the stream of inert gas may not provide sufficient pressure for removing such deposited contamination. Over time, the deposited contamination, which typically includes residuals of metals of various kinds originating from the analyzed samples, may form a conducting layer or conducting areas on the inner surfaces of the plasma chamber, which increases the risk of arc-overs. Moreover, at least part of the metallic contamination deposited on the inner surfaces may come off due to heat generated during subsequent measurements and, consequently, distort these measurements if originating from sample(s) different from the one currently under measurement, thereby causing so-called memory effect.

Therefore, the structure of the plasma chamber typically allows for exposing an interior of the plasma chamber for abrasive cleaning that enables removing the contamination deposited on the inner surfaces of the plasma chamber. However, frequent abrasive cleaning is both tedious and typically also results in wear of the polished inner surfaces of the plasma chamber over time. Consequently, novel solutions that facilitate keeping the plasma chamber clean contribute both towards longer lifetime of the plasma chamber and towards improved accuracy and reliability of analysis of elemental composition via operation of the OES instrument making use of the plasma chamber.

SUMMARY

It is an object of the present invention to provide a plasma chamber that facilitates accurate and reliable analysis of elemental composition of samples over a series of measurements.

According to an example embodiment, a spark stand assembly for an OES instrument is provided, the spark stand assembly comprising: a spark stand body that at least partially defines a plasma chamber; an exciter at least partially disposed inside the plasma chamber; and an optical transmission path from the plasma chamber for providing a view to a plasma generated in the plasma chamber, wherein the plasma chamber is provided with an opening for exposing a part of a sample positioned on the opening for excitation from the exciter so as to generate plasma on a surface of the sample upon activation of the exciter, and wherein a coating layer that comprises a tribological coating is arranged to cover at least a portion of surfaces of the plasma chamber.

According to another example embodiment, an OES instrument is provided, wherein the OES instrument comprises a main housing and a spark stand assembly according to the example embodiment described in the foregoing, wherein the main housing comprises an optical spectrometer assembly coupled via an optical interface to said optical transmission path of the spark stand assembly.

The exemplifying embodiments of the invention presented in this patent application are not to be interpreted to pose limitations to the applicability of the appended claims. The verb "to comprise" and its derivatives are used in this patent application as an open limitation that does not exclude the existence of also unrecited features. The features described hereinafter are mutually freely combinable unless explicitly stated otherwise.

Some features of the invention are set forth in the appended claims. Aspects of the invention, however, both as to its construction and its method of operation, together with additional objects and advantages thereof, will be best understood from the following description of some example embodiments when read in connection with the accompanying drawings.

BRIEF DESCRIPTION OF FIGURES

The embodiments of the invention are illustrated by way of example, and not by way of limitation, in the figures of the accompanying drawings, where FIG. 1 schematically illustrates an optical emission spectroscopy (OES) instrument according to an example.

DESCRIPTION OF SOME EMBODIMENTS

Figure 1:
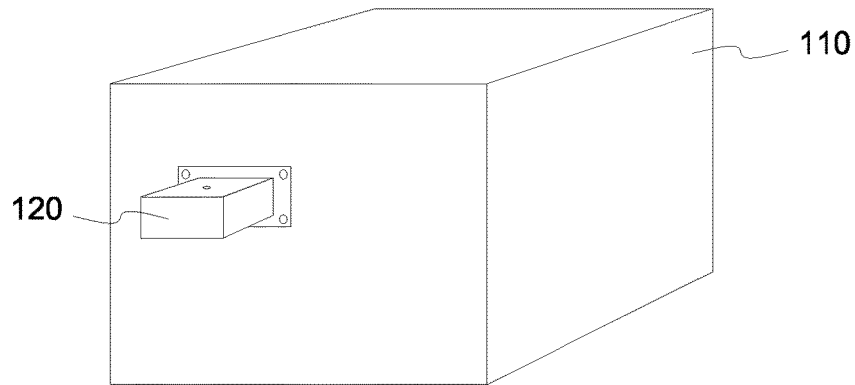
Figure 2:
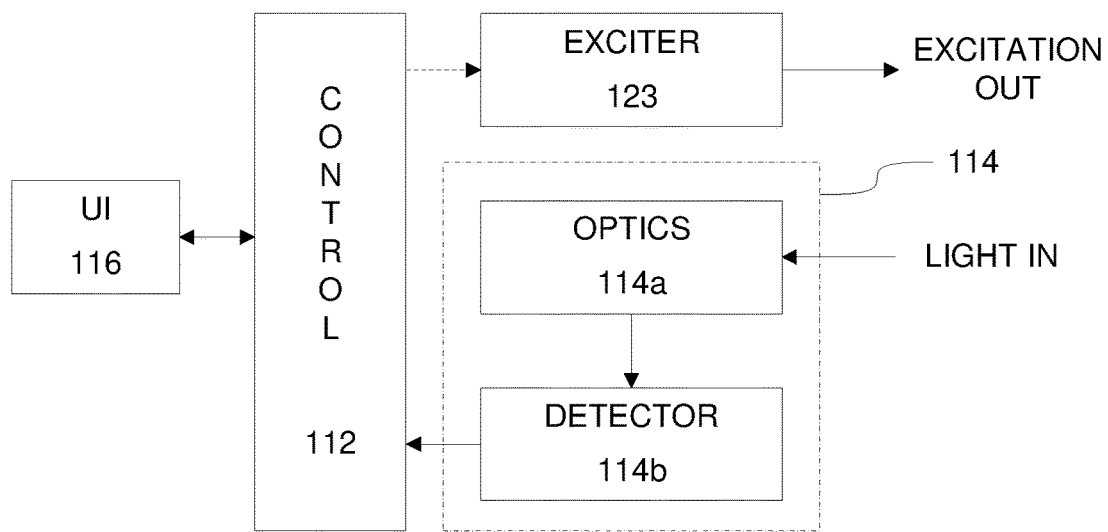
FIG. 2 illustrates a block diagram of some elements of an OES instrument according to an example.

FIG. 1 schematically illustrates an OES instrument 100 according to an example. In this regard, the illustration of FIG. 1 depicts a main housing 110 of the OES instrument 100 and a spark stand assembly 120 mounted to the main housing 110. In the example of FIG. 1 the spark stand assembly 120 may be mounted to the main housing 110 in a detachable manner, such that spark stand assembly 120 may be attached to the main housing 110 for carrying out measurements for one or more samples and it may be unmounted from the main housing 110 for cleaning and/or maintenance. FIG. 2 illustrates a block diagram of some (logical) elements of the OES instrument 100 according to an example, including a controller 112, an exciter 123, an optical spectrometer assembly 114 and a user interface (UI) 116. The OES instrument may be suitable for analysis of any samples having a conductive surface, such as samples comprising or consisting of metal(s).

The main housing 110 serves to accommodate one or more components of the OES instrument 100 and the main housing 110 may further comprise e.g. storage space for accessories and/or materials that may be applicable for operating the OES instrument 100. In this regard, the main housing 110 may include a mounting interface for mounting the spark stand assembly 120, which enables mechanical attachment between the spark stand assembly 120 and the main housing 110 and provides optical and electrical interfaces between components of the spark stand assembly 120 and components provided in or coupled to the main housing 110. The main housing 110 may comprise (or have coupled thereto) the UI 116 for operating at least some aspects of the OES instrument 100, where the UI 116 may comprise one or more user input devices (such as a keyboard, a mouse, a touch panel, a touch screen, an arrangement of one or more keys, buttons, switches, etc.) for providing user input for controlling various aspects related to operation of the OES instrument 100 and a display apparatus for displaying information such as information regarding operational status of the OES instrument 100 and measurement results to a user. The OES instrument 100 may enable analysis of elemental composition of a sample using one or more OES techniques, such as spark OES and/or arc OES.

The main housing 110 further comprises the optical spectrometer assembly 114 including spectrometer optics 114a and a light detector assembly 114b, whereas the main housing 110 further provides an optical transmission path that optically couples the optical interface of the mounting interface to the spectrometer optics 114a of the optical spectrometer assembly 114. This transmission path may be referred to as a first transmission path and it may enable transfer of light received from the spark stand assembly 120 via the optical interface of the mounting interface to the optical spectrometer assembly 114. The spectrometer optics 114a may disperse the light received via the first transmission path into a set of wavelengths, whereas the light detector assembly 114b may generate one or more measurement signals that are descriptive of relative light intensities of the dispersed light emission at different wavelengths, which may appear e.g. as one or more emission peaks at respective wavelengths. As an example in this regard, the light detector assembly 114b may comprise a light detector array including a plurality of light detectors, such as an arrangement of photomultiplier tubes mounted behind respective rectangular apertures that allow for only a narrow wavelength band to pass through. According to another example, the light detector assembly 114b may comprise an image sensor, where the image sensor may be provided as a charge-coupled device (CCD), as a complementary metal-oxide-semiconductor (CMOS) sensor or, in general, as any (silicon-based) solid state sensor, the light detector assembly 114b thereby substantially capturing one or more images of dispersed light received from the spectrometer optics 114a.

The main housing 110 may further comprise the controller 112 that is communicatively coupled to the UI 116 and to the detector assembly 114b of the optical spectrometer assembly 114 to enable transfer of control information and data (such as measurement results) between the controller 112 and the UI 116 and to enable the controller 112 receiving the one or more measurement signals from the light detector assembly 114*b*. The controller 112 may be further communicatively coupled to the electrical interface of the mounting interface, which enables electrical coupling between the controller 112 and one or more components provided in the spark stand assembly 120 when it is mounted to the main housing 110 via the mounting interface. The controller 112 may be further communicatively coupled to one or more (other) components provided in the main housing 110 and/or the one or more (other) components provided in the main housing 110 may be communicatively coupled to one or more components provided in the spark stand assembly 120 via the electrical interface. As a particular example of making use of the electrical interface in this regard, the exciter 123 may comprise an excitation source provided in the main housing 110 and an electrode provided in the spark stand assembly 120, where the excitation source may be operated under control of the controller 112 to provide electrical power to be provided via the electrical interface to the electrode, thereby allowing for activation of the exciter 123 via operation of the controller 112. The respective communicative couplings between the controller 112 and the electrical interface of the mounting interface and/or between the controller 112 and one or more other components provided in the main housing 110 may be provided using respective electrical signals conveyed e.g. via respective one or more electrical wires.

As a particular example of operation of the OES instrument 100, the controller 112 may conduct a measurement procedure to determine at least some aspects of elemental composition of a sample under study, where the measurement procedure may be carried out in response to a trigger signal that may be received in response to a user operating the UI 116 accordingly. Assuming that the exciter 123 includes the excitation source and the electrode (as typical for an OES instrument for arc or spark OES), the measurement procedure may involve the controller 112 operating the excitation source to activate the electrode for a predefined time period to generate an excitation that results in transforming a fraction of the sample under study into a plasma state, recording the one or more measurement signals generated at the light detector assembly in response to the light emitted from the plasma and received at the light detector assembly 114*b* via the spectrometer optics 114*a*, and carrying out an analysis of elemental composition of the sample under study based on the recorded one or more measurement signals (e.g. via comparison to respective reference spectra of one or more samples of known elemental composition). The measurement procedure of a kind described above is well known in the art and it is outlined herein for the sake of completeness of the description.

The spark stand assembly 120 may comprise a spark stand body that is attached to a mounting flange, which may be attachable to the main housing 110 of the OES instrument 100 via the mounting interface provided therein. The mounting flange may enable mechanical attachment to the mounting interface and provide the optical and electrical connections between the spark stand assembly 120 and the components provided in or coupled to the main housing 110, whereas the spark stand body may be attached to a mounting flange. In this regard, the term mounting flange is to be construed broadly, encompassing basically any 'interfacing element' that is attachable to the mounting interface of the main housing 110 of the OES instrument 100.

Figure 3:
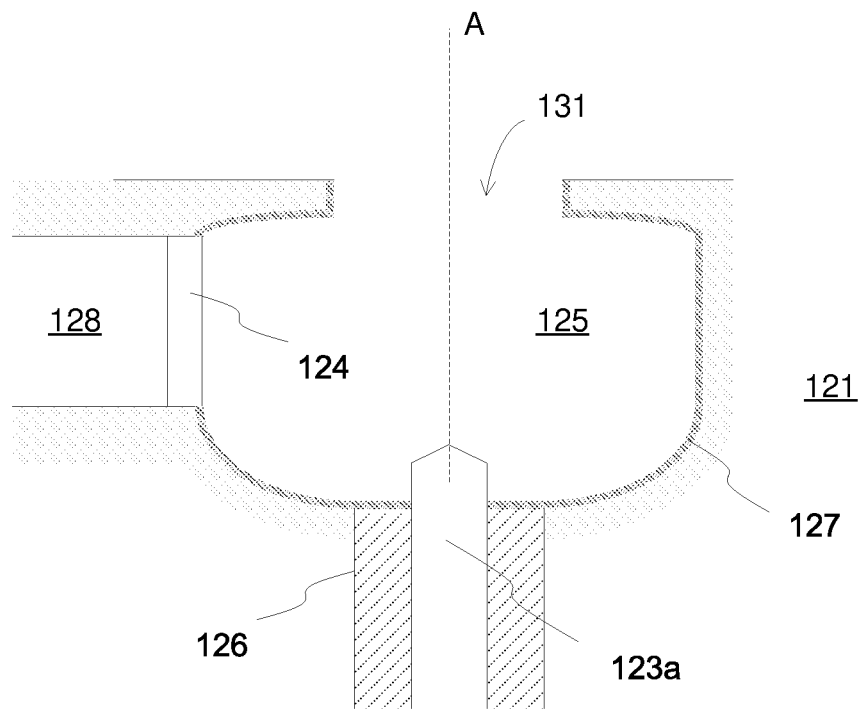
FIG. 3 schematically illustrates some aspects of a spark stand assembly according to an example.

Typically, the plasma is generated in a plasma chamber that may be provided as part of the spark stand assembly 120. FIG. 3 schematically illustrates an example in this regard, showing a cross-section of a spark stand body 121, where a plasma chamber 125 is provided as a cavity arranged in the spark stand body 121. In other words, the spark stand body 121 defines the cavity, which serves as the plasma chamber 125. The spark stand assembly 120 further comprises an electrode 123*a* serving as a component of the exciter 123, where the electrode 123*a* is at least partially disposed inside the plasma chamber 125. The side of the cavity that is opposite to the electrode 123*a* is provided with an opening 131 through a top surface of the spark stand body 121, where the opening 131 may be positioned such that it is spatially aligned with the electrode 123*a*. In this regard, the spatial alignment means that a projection of the opening 131 along a line that is perpendicular to the top surface of the spark stand body 121 encompasses a tip of the electrode 123*a*, e.g. such that the tip of the electrode 123*a* resides substantially at the center of said projection (indicated by a dashed line A in the illustration of FIG. 3). The top surface of the spark stand body 121 around the opening 131 may be planar or substantially planar for positioning of a sample under study such that it closes the plasma chamber 125 in a gas-tight manner. This aspect is discussed in the following in further detail.

The portion of the exciter 123 that protrudes to the plasma chamber 125 comprises the part of the exciter 123 that is applicable for generating the excitation, whereas the remaining part of the exciter 123 may reside outside the plasma chamber 125. As an example in this regard, assuming that the exciter comprises the excitation source and the electrode 123*a*, a tip of the electrode 123*a* may reside inside the plasma chamber 125 (as in the example of FIG. 3) while the remaining part of the electrode 123*a* may be embedded into the spark stand body 121. In this regard, the electrode 123*a* may be mounted to the spark stand body 121 via an insulator sleeve 126 (or via an insulation arrangement of other kind) that may be made of suitable ceramic material. In an example, the insulator sleeve 126 may comprise a sheath made of ceramic material that surrounds the electrode 123*a* such that the tip of the electrode 123*a* is exposed into the plasma chamber 125. In other words, the electrode 123*a* may be partially enclosed within the insulator sleeve 126 such that the tip of the electrode 123*a* is exposed from the insulator sleeve 126, whereas a portion of the insulator sleeve 126 (e.g. an 'upper' end of the sheath) may serve as part of the inner surface of the plasma chamber 125 (e.g. at least part of a 'bottom' of the plasma chamber 125), thereby exposing the tip of the electrode 123*a* into the plasma chamber 125. In an example, the insulator sleeve 126 may comprise a substantially cylindrical element made of ceramic material and having an opening therethrough, where the electrode 123*a* may be arranged into the opening such that its tip protrudes from one end of the cylindrical element to enable placing it within the cavity that forms the plasma chamber 125 with the respective end of the cylindrical element forming at least part of the bottom of the cavity.

The spark stand assembly 120 further comprises an optical transmission path for providing a view to the plasma generated in the plasma chamber 125 upon activation of the exciter 123. The optical transmission path provided in the spark stand assembly 120 may be referred to as a second transmission path and it may serve for transferring light emitted from the plasma (to be) generated in the plasma chamber 125 via an opening through the mounting flange towards the spectrometer assembly. In this regard, when the spark stand assembly 120 is mounted to the main housing 110, the second transmission path provided in the spark stand assembly 120 is aligned with the first transmission path provided in the main housing 110, thereby forming a path of transmission that allows for transmitting the light emitted from the plasma generated in the plasma chamber 125 to the spectrometer assembly 114. In the example of FIG. 3, the second transmission path provided in the spark stand assembly 120 may involve an opening 128 through the spark stand body 121 that connects the plasma chamber 125 to the opening through the mounting flange.

Figure 4:
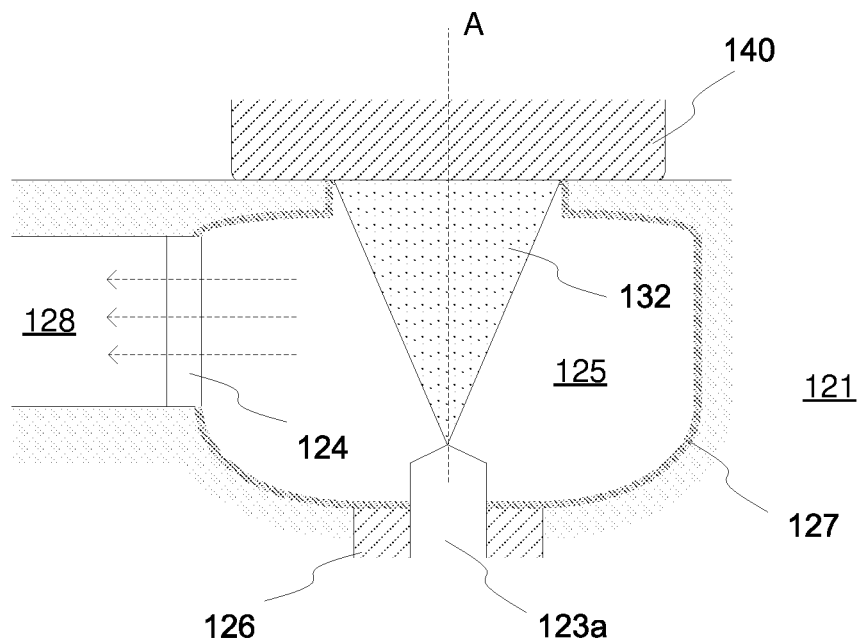
FIG. 4 schematically illustrates generation of plasma via usage of a spark stand assembly according to an example.

In the examples illustrated in FIGS. 3 and 4, the spark stand assembly 120 comprises a transmission window 124 that closes the opening 128 in a gas-tight manner while transmitting the light emitted from the plasma (to be) generated in the plasma chamber 125 therethrough. The transmission window 124 hence isolates the plasma chamber 125 from the opening 128, thereby forming a gas-tight enclosure apart from the opening 131 through the top surface of the spark stand body 121. The transmission window 124 also serves as part of the inner surface of the plasma chamber 125, thereby preventing any contamination and/or debris generated during generation of plasma from entering the opening 128 that serves to provide the second transmission path.

The spark stand body 121 may be made of durable material that is able to withstand the heat resulting from the plasma generated in the plasma chamber 125. Examples of suitable materials include metals such as stainless steel (e.g. EN 1.4305, EN 1.4301, EN 1.0050, EN 1.0760 or EN 2.0376). At least a portion of the surface of the plasma chamber 125 may be further provided with a coating layer 127, as illustrated in the examples of FIGS. 3 and 4. The coating layer 127 may comprise a tribological coating, such as one made of diamond-like carbon (DLC), which is able to withstand the heat resulting from generation of the plasma. The DLC may be also referred to as amorphous carbon. As an example, the coating layer 127 may be provided on the surfaces of the plasma chamber 125 apart from the transmission window 124, the coating layer 127 thereby covering respective surfaces of the spark stand body 121 that define the cavity and the insulator sleeve 126. According to another example, the coating layer 127 may leave one or more further portions of the surface of the plasma chamber 125 (in addition to the transmission window 124) uncovered, e.g. such that the coating layer 127 covers respective surfaces of the spark stand body 121 that define the cavity while leaving the insulator sleeve 126 uncovered.

Coatings made of DLC have previously found applications, for example, in propulsion technology, in engine technology and in medical technology (e.g. in joint implants), where surfaces having a low friction and a high abrasion resistance are typically required. The DLC belongs to a class of materials that have favorable mechanical and chemical properties that make them suitable as coatings in various applications e.g. in the above-mentioned areas of technology. The DLC primarily comprises carbon in its two binding modifications, i.e. graphite-binding (sp2) and diamond binding (sp3). The interaction of those binding modifications in the resulting coating material is reflected in the material properties that lie between graphite and diamond. The most important properties of such coating materials include high chemical stability, low coefficient of friction (in a range from 0.05 to 0.2 against dry steel) and high hardness (15-60 GPa), which is only surpassed by diamond itself. Hydrogen is often integrated into the coating material as well, resulting in different compositions within the material diagram sp2-sp3-H. Depending on hydrogen content, the resulting coating material may be referred to as hydrogen-containing amorphous carbon (a-c:h) or hydrogen-free amorphous carbon (a-c), whereas ta-c refers to (hydrogen-free) primarily tetragonally-bound (sp3) amorphous carbon. By variation of material composition regarding the binding types sp2 and sp3 and hydrogen content, material properties can be influenced and optimized for the task at hand. As an example, some applications may not require maximum hardness but may require minimum friction and vice versa.

In addition to properties of a surface provided with a coating layer made of DLC, it is likewise important to provide a strong adhesion or bonding of the coating layer to the surface to be coated. In this regard, also other elements may be doped into the coating material (instead of or in addition to hydrogen), e.g. nitrogen, oxygen, silicon or certain metals. In such a scenario the resulting material may be referred to as a-c:h:x, where x is a placeholder for a material introduced to the coating material via doping, e.g. one of the above-mentioned elements. Such doping results in altering characteristics of the coating material depending on the applied dopant: e.g. nitrogen doping (N-doping) may be applied to increase electrical conductivity of a-c:h coatings by several orders of magnitude, whereas silicon doping (Si-doping) and oxygen doping (O-doping) may be applied to increase temperature-stability and optical transparency of the coating material.

There are different processes available for manufacturing DLC coatings, such as physical vapor deposition (PVD), chemical vapor deposition (CVD) and various combinations thereof, which enable providing e.g. the coating materials described above in order to provide a coating with desired characteristics. Affordability and flexibility of the applied manufacturing process(es) may play an important role in making such coating materials widely applicable. Such requirements may be fulfilled via processes that involve combination of different manufacturing techniques. An example of such an advantageous manufacturing process is Plasmaimpax® process, which is described in the following in some detail. However, this procedure serves as an illustrative and non-limiting example of providing the coating layer 127 according to the present disclosure. The Plasmaimpax® process involves a combination of plasma-assisted CVD (PACVD) and ion implantation process. This process employs very high particle energies reaching up to 30 keV, where ions are pulsed and targeted at components to be coated, making it possible to implant them into the volume below the surface of the components as a pre-treatment before coating or as a way of surface hardening by causing either phase-formation or the introduction of defects. Pre-treatment of surfaces also includes sonicating and subsequent plasma cleaning in an argon, oxygen or hydrogen atmosphere (e.g. radio powered or microwave powered glow discharge to remove adsorbates from the surface) to ensure good bonding between the surface to be coated and the coating.

In-situ deposition of a-c:h layers via the Plasmaimpax® process may be carried out in a consecutive process step. Due to the relatively high particle energies in the ion-implantation process, the coating process may be carried out at a relatively low temperatures from 200 to 250° C. thus preventing components from damage or distortion through excessive heat. The pre-treatment step and the subsequent coating step may be carried out via usage of a single Plasmaimpax® processor, thereby dispensing with the need to remove the components to be coated from the protective atmosphere (provided e.g. via vacuum or inert gas) for the subsequent processing steps, which facilitates reliable bonding between the coating and the surface to be coated and flexibility of the coating process. The coating process may be carried out under reduced pressure, e.g. in the range between 10-2 and 10-3 mbar, in an inert or a reactive atmosphere. The Plasmaimpax® process for depositing an a-c:h layer may comprise a combination of deposition of carbon complexes from their gaseous phase under simultaneous, pulsed bombardment of argon ions. This ion-supported deposition leads to the compression of the deposited material, which in turn serves to increase layer density. The combination of amorphous and dense layer structure and the chemical stability of carbon renders excellent anti-corrosive properties for the a-c:h layer. Ion bombardment also facilitates formation of sp3 bindings responsible for layer hardness. At the same time, those layers display high elasticity (E-module: 180 GPa) contrary to conventional hard layers such as titanium nitride (TiN), which are brittle and fail to provide corrosion protection due to their crystalline material structure. Another advantage of DLC layers, besides their hardness and their chemical stability, is their extremely low coefficient of friction. Various experiments have verified the durability of surfaces coated by a-c:h coatings in comparison to unprotected surfaces, to an extent showing friction coefficients of lowest achievable value to date, thereby making such coatings especially well-suited for tribological applications. Bonding strength of a-c:h coatings may vary from good (HF2) to excellent (HF1). Coating thicknesses of a-c:h coatings typically vary in a range from 2 to 3 μm, which typically makes it possible to manufacture, grind or polish components that are to be coated to their final dimensions without the need for tedious post processing.

When operating the spark stand assembly 120 as part of operation of the OES instrument 100, a sample 140 may be positioned on the top surface of the spark stand body 121 such that the sample 140 covers the opening 131 while exposing a part of the surface of the sample 140 for excitation, as schematically illustrated in FIG. 4. It should be noted that for graphical clarity of the illustration, the reference number indicating the opening 131 is omitted from FIG. 4. However, the position of the opening 131 in the illustration of FIG. 4 is readily apparent via comparison to the illustration of FIG. 3. In this regard, the sample 140 positioned on the opening 131 seals the plasma chamber in a gas-tight manner while exposing a portion of the sample 140 at the location of the opening 131 for producing excitation via activation of the electrode 123a, thereby enabling generation of a plasma cone 132 on the surface of the sample 140. The gas-tight sealing may be facilitated by suitable preparation of the sample 140 (such as grinding or milling) and/or by positioning the sample 140 on the opening via application of an adaptor element that ensures sealing of the opening 131 and/or correct positioning of the sample 140 with respect to the opening 131. The gas-tight sealing of the plasma chamber during the measurement procedure is advantageous in terms of reliability and repeatability of measurements in general, whereas it may be a crucial characteristic for the measurement procedure in order to detect certain elements, such as nitrogen or oxygen as well as for measurements where the UV transmissive atmosphere is created via injecting inert gas (such as argon) to the plasma chamber.

Figure 5:
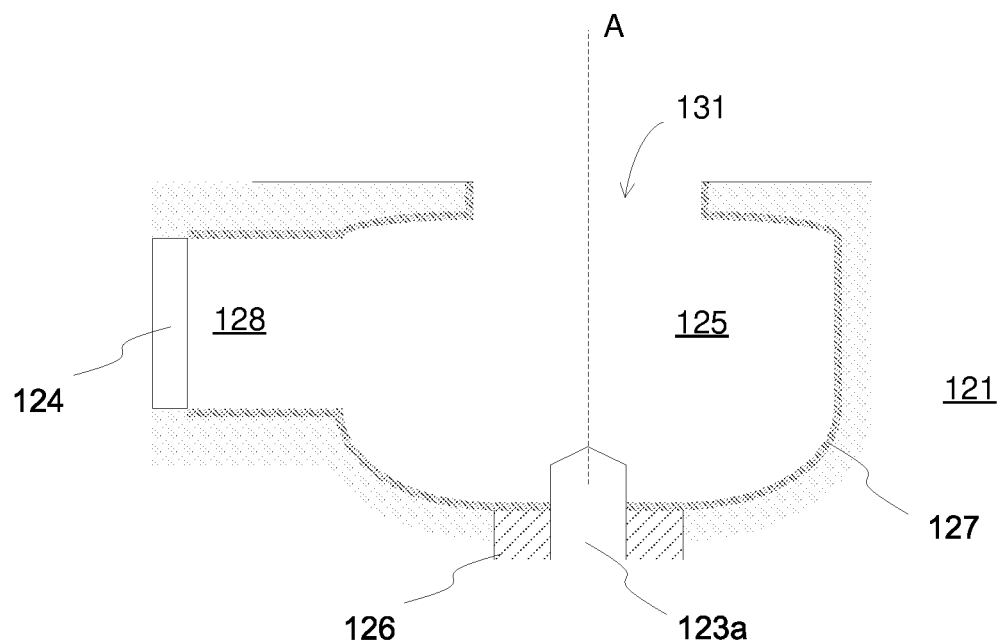
FIG. 5 schematically illustrates some aspects of a spark stand assembly according to an example.

FIG. 5 schematically illustrates a cross-section of the spark stand body 121 according to another example, which is a variation of the example provided in FIG. 3. In this regard, the difference to the example of FIG. 3 is that the transmission window 124 is disposed in the opening 128 through the spark stand body 121 at a (non-zero) distance from the plasma chamber 125 formed by the cavity in the spark stand body 121. As in the example of FIG. 3, also in this example the transmission window 124 closes the opening 128 in a gas-tight manner while transmitting the light emitted from the plasma (to be) generated in the plasma chamber 125 therethrough. The transmission window 124 hence isolates the plasma chamber 125 and a first portion of the opening 128 from the remainder of the opening 128, the plasma chamber 125 and the first part of the opening 128 thereby serving as an extended plasma chamber. The distance between the plasma chamber 125 and the transmission window 124 may be chosen according to the circumstances in consideration of optical characteristics of the path of transmission from the plasma chamber 125 to the spectrometer assembly 114. In this regard, making the distance between the plasma chamber 125 and the transmission window 124 as long as possible may facilitate reduced contamination of the transmission window 124.

In further examples, the transmission window 124 may be disposed in the opening through the mounting flange, in the optical interface of the mounting interface provided in the main housing 110 or in the first transmission path (in the main housing 110). In respective variations of the examples described in the present disclosure, the transmission window 124 may be replaced by a coupling lens that serves both to close the path of transmission from the plasma chamber 125 to the spectrometer assembly 114 in a gas-tight manner and to provide a view to the plasma (to be) generated in the plasma chamber such that an image of the plasma is formed in a desired position with respect to the entrance aperture to the spectrometer optics 114a.

In the example of FIG. 5, the coating layer 127 may further cover the surface(s) of the opening 128 from the cavity to the transmission window 124, i.e. the surface(s) of the first portion of the opening 128 between the plasma chamber 125 and the transmission window 124 (or the coupling lens). In examples where the transmission window 124 is provided outside the spark stand assembly 120 (e.g. in the first transmission path provided in the main housing 110 of the OES instrument 100), the coating layer 127 may cover the surface(s) of the opening 128 in their entirety.

Figure 6:
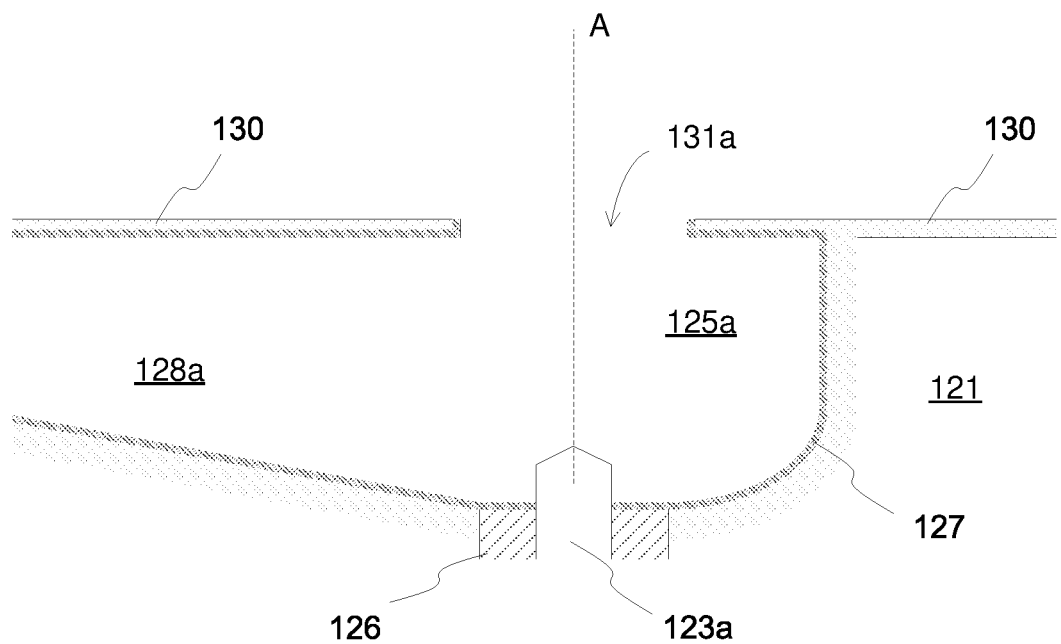
FIG. 6 schematically illustrates some aspects of a spark stand assembly according to an example.
Figure 7:
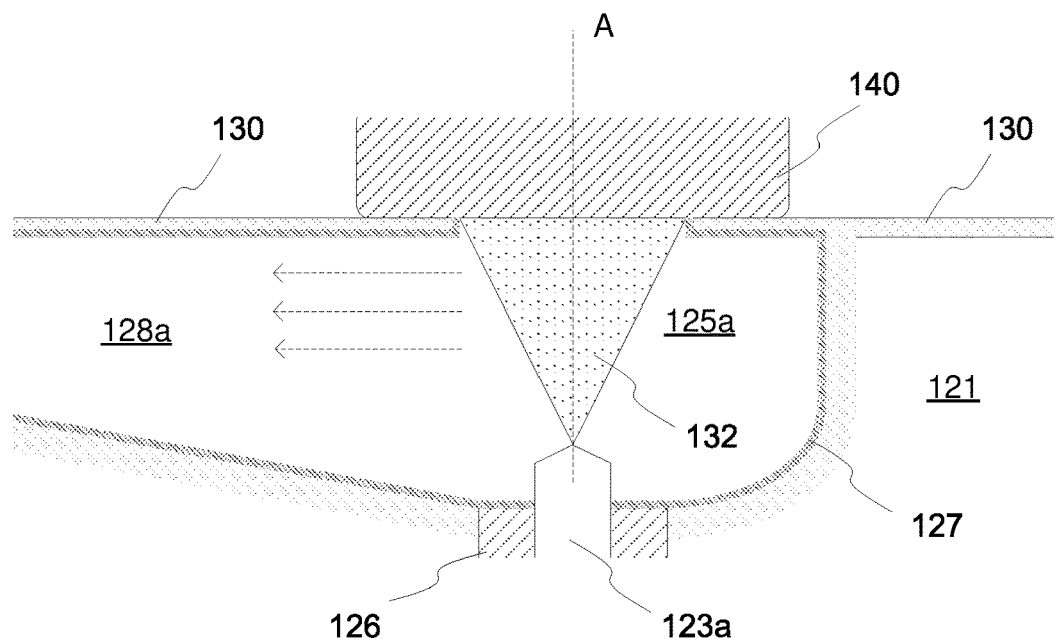
FIG. 7 schematically illustrates generation of plasma via usage of a spark stand assembly according to an example.

FIG. 6 schematically illustrates a cross-section of the spark stand body 121 according to a further example, which is a variation of the examples illustrated in FIGS. 3 and 5, whereas FIG. 7 schematically illustrates the formation of the plasma cone 132 in a spark stand body 121 according to the example of FIG. 6, which is different from that according to the examples of FIGS. 3 and 5 in that a plasma chamber 125a is formed by a recess arranged in the top surface of the spark stand body 121. In other words, the spark stand body 121 defines the recess, which serves as the plasma chamber 125a. The top surface of the spark stand body 121 may be further provided with a groove 128a that extends from the recess that forms the plasma chamber 125a and it may serve as part of the second transmission path. In this regard, the groove 128a may connect the recess to the opening through the mounting flange. Moreover, the top surface of the spark stand body 121 may be arranged for reception of a spark stand plate 130 that covers the recess and the groove 128a apart from an opening 131a through the spark stand plate 130 that may be positioned such that it is spatially aligned with the electrode 123a when the spark stand plate 130 is arranged into its position on the top surface of the spark stand body 121. The spark-stand-body-facing surface (i.e. an inner surface) of the spark stand plate 130 may have a shape that substantially follows the shape of the top surface of the spark stand body 121 apart from a portion that spatially coincides with the recess forming the plasma chamber 125*a* and the groove 128*a*, whereas the opposite surface (i.e. an outer surface) of the spark stand plate 130 may be planar or substantially planar for positioning of a sample under study such that the sample closes the plasma chamber 125*a* in a gas-tight manner.

The spark stand plate 130 may be detachably attachable on the top surface of the spark stand body 121 via usage of an attachment mechanism provided for holding the spark stand plate 130 against the top surface of the spark stand body 121, such as a set of clamps that enable securing the spark stand plate 130 on the top surface of the spark stand body 121 and releasing the spark stand plate 130 from the spark stand body 121. The top surface of the spark stand body 121 and/or the inner surface of the spark stand plate 130 may be provided with a sealing arrangement that ensures a gas-tight sealing of the plasma chamber 125*a* and the groove 128*a* when the spark stand plate 130 is secured in its position on the top surface of the spark stand body 121, thereby facilitating the gas-tight sealing of the plasma chamber 125*a* for generation of plasma therein as part of measurements carried out by the OES instrument 100.

In the example of FIG. 6, the second transmission path provided in the spark stand assembly 120 may involve the groove 128*a* that connects the plasma chamber 125*a* to the opening through the mounting flange. The depth and width of the groove 128*a* may be chosen according to the circumstances. According to an example, the groove 128*a* may have a depth that varies with the distance from the recess that forms the plasma chamber 125*a*. As an example in this regard, the depth of the groove 128*a* may steadily decrease from a first end of the groove 128*a* at the recess to a second end of the groove 128*a* at the opening through the mounting flange, where the bottom of the groove 128*a* at its first end may be substantially aligned with the bottom of the recess (e.g. with the 'upper' end of the insulator sleeve 126), the bottom of the groove 128 thereby forming a 'slope' that descends towards the bottom of the recess. Such a shape of the groove 128*a* facilitates removing any contamination and/or debris generated in the course of measurements from the groove 128*a* and/or from the plasma chamber 125*a* via injecting a stream of inert gas. According to an example, a cross-section of the groove 128*a* may have a shape that gets narrower towards the bottom of the groove 128*a* (e.g. a u-shape or a v-shape), which may likewise facilitate removal of the contamination and/or debris from the groove 128*a* and/or from the plasma chamber 125*a* via injecting a stream of inert gas.

In scenarios where the spark stand assembly 120 according to the example illustrated in FIG. 6 is applied, the transmission window 124 (or the coupling lens) may be provided, for example, in the opening through the mounting flange, in the optical interface of the mounting interface provided in the main housing 110 or in the first transmission path (in the main housing 110). Alternatively, the transmission window 124 (or the coupling lens) may be included in the spark stand assembly 120 e.g. by arranging it in the groove 128*a* in a manner similar to that illustrated in the example of FIG. 5, mutatis mutandis. In other words, the transmission window 124 (or the coupling lens) may be positioned at a desired position along the groove 128*a* such that it isolates the plasma chamber 125*a* and a first portion of the groove 128*a* from the remainder of the groove 128*a* when the spark stand plate 130 is arranged on its position on the top surface of the spark stand body 121, the plasma chamber 125*a* and the first portion of the groove 128*a* hence serving as an extended plasma chamber.

According to an example in the framework of the example of FIG. 6, the coating layer 127 may be provided on the respective surfaces of the plasma chamber 125*a* and the groove 128*a* as well as on portion(s) of the inner surface of the spark stand plate 130 that serve as respective surfaces of the plasma chamber 125*a* and the second transmission path formed in the groove 128*a* when the spark stand plate is arranged into its position on the top surface of the spark stand body 121, the coating layer 127 thereby covering respective surfaces of the spark stand body 121 that define the recess and the groove 128*a*, the insulator sleeve 126 and those portions of the inner surface of the spark stand plate 130 that spatially coincide with the recess and the groove 128*a* provided in the top surface of the spark stand body 121 when the spark stand plate is arranged into its position on the top surface of the spark stand body 121. According to another example, the coating layer 127 may leave one or more portions of the surface(s) of the extended plasma chamber uncovered, e.g. such that the coating layer 127 covers respective surfaces of the spark stand body 121 that define the recess while leaving at least a portion of surfaces of the groove 128*a*, the insulator sleeve 126 and/or at least part of the portion(s) of the inner surface of the spark stand plate 130 that serve as respective surfaces of the plasma chamber 125*a* and the second transmission path uncovered. In a scenario where the transmission window 124 is arranged in the groove 128*a* to isolate the plasma chamber 125*a* and the first portion of the groove 128*a* from the remainder of the groove 128*a*, the coating layer 127 may cover the surface(s) of the first portion of the groove 128*a*.

Usage of the spark stand plate 130 that is detachably attachable to the spark stand body 121 is advantageous in that it allows for exposing the plasma chamber 125*a* and the groove 128*a* for cleaning between measurements in order to remove the debris and/or contamination that necessarily accumulates e.g. on respective surfaces of the plasma chamber 125*a* and the groove 128*a* in the course of measurements carried out via usage of the spark stand assembly 120. Exposing the plasma chamber 125*a* and the groove 128*a* for cleaning may be especially advantageous in facilitating abrasive cleaning required to remove residuals of metals that are typically deposited on the surface(s) of the plasma chamber 125*a* over time in the course of measurements carried out.

Throughout the examples described in the foregoing, the inner surface of the spark stand plate 130 may be substantially planar at least in locations that spatially coincide with the plasma chamber 125*a* and the groove 128*a* arranged in the top surface of the spark stand body 121. Such structure of the spark stand plate 130 is straightforward to manufacture while it also facilitates abrasive cleaning of the portions of the spark stand plate 130 that are exposed for contamination and/or debris generated during formation of the plasma cone 132.

Figure 8:
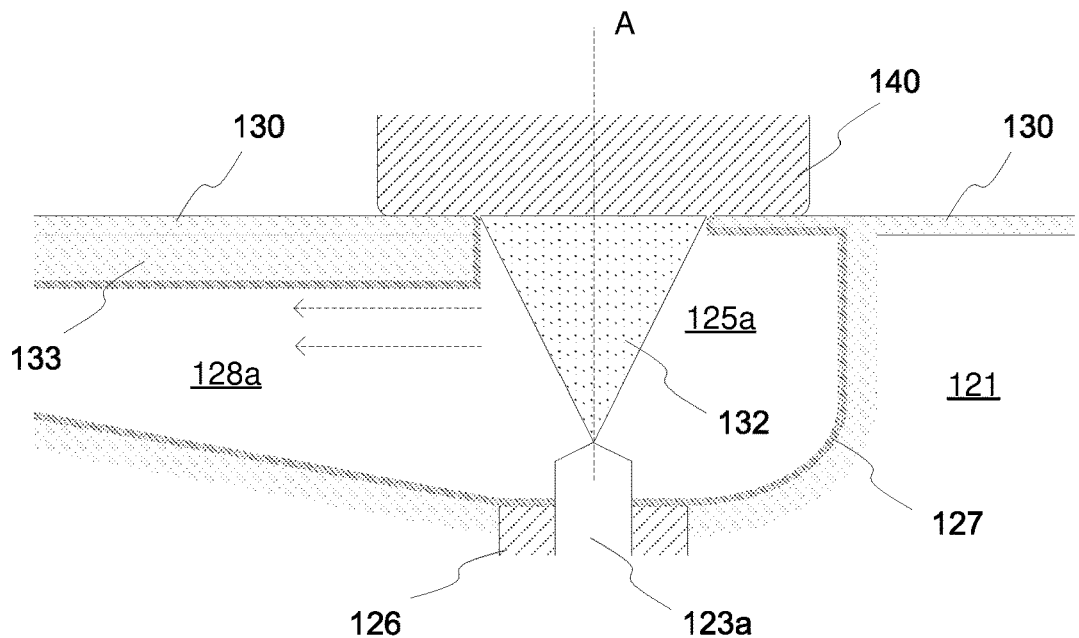
FIG. 8 schematically illustrates some aspects of a spark stand assembly according to an example and generation of plasma using the spark stand assembly.

In another example, the spark stand plate 130 may be provided with a spatial mask that protrudes from its spark-stand-body-facing surface in a location that spatially coincides with the groove 128*a* when the spark stand plate 130 is arranged into its position on the top surface of the spark stand body 121. Consequently, the spatial mask may be applied to partially block the second transmission path between the plasma chamber 125*a* and the opening through the mounting flange, thereby partially obstructing the view from the spectrometer assembly 114 to the plasma cone 132 (to be) generated in the plasma chamber 125*a* and, in particular, obstructing the view to the hottest portion of the plasma cone 132 at and close to its base (in immediate vicinity of the surface of the sample under study) in order to improve analysis performance of the OES instrument 100. Various characteristics of such a spatial mask and advantages arising from its usage are described in a co-pending European patent application no. 22182557, whereas FIG. 8 schematically illustrates a cross-section of the spark stand body 121 according to an example, where the spatial mask is provided as a masking portion 133 that is integrated to a portion of the spark stand plate 130 that spatially coincides with the groove 128a. In case the spark stand plate 130 is provided with the spatial mask, the coating layer 127 may also cover the spatial mask or part thereof.

Figure 9:
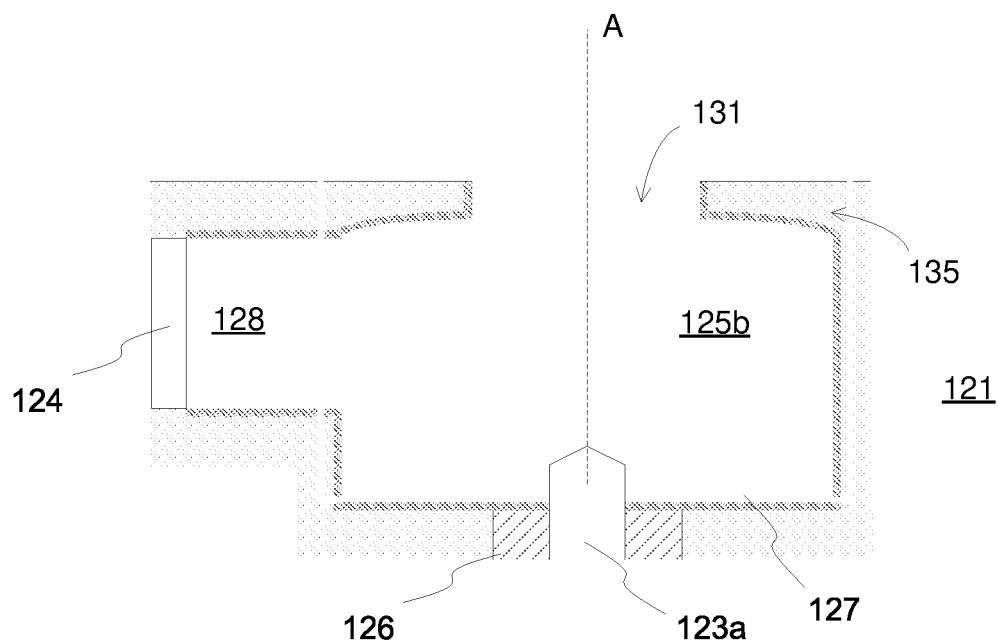
FIG. 9 schematically illustrates some aspects of a spark stand assembly according to an example.

FIG. 9 schematically illustrates a cross-section of the spark stand body 121 according to a further example, which may be considered as a variation of the spark stand body 121 according to the example of FIG. 5. In this example, the top surface of the spark stand body 121 is provided with a recess that is suitable for receiving a plasma chamber element 135. The electrode 123a and the insulator sleeve 126 are arranged in the spark stand body 121 such that the 'upper' end of the sheath serving as the insulator sleeve 126 forms at least part of the 'bottom' of the recess, whereas the tip of the electrode 123a is exposed into the recess, as described in the foregoing with references to the example of FIG. 3. The plasma chamber element 135 has a shape and size substantially matching those of the recess to allow for inserting the plasma chamber element 135 into the recess. The plasma chamber element 135 defines a cavity therein, whereas a first end of the plasma chamber element 135 that is intended for facing the bottom of the recess may be substantially open and a second end that is opposite to its first end may be substantially closed but provided with an opening 131 therethrough to the cavity defined therein. Hence, according to an example, the cavity defined within the plasma chamber element 135 may have a shape of a bell or a(n inverted) cup with the opening 131 through its 'closed' end.

When the plasma chamber element 135 is arranged into its position in the recess, its open first end is positioned against the bottom of the recess, the plasma chamber element 135 and the bottom of the recess hence forming a plasma chamber 125b. The opening 131 through the second end of the plasma chamber element 135 enables exposing part of the surface of a sample arranged to cover the opening 131 for plasma generation upon activation of the electrode 123a. The opening 131 may be positioned in the second end of the plasma chamber element 135 such that it is spatially aligned with the electrode 123a (as described in the foregoing) when the plasma chamber element 135 is arranged into its position in the recess provided in the spark stand body 121.

The spark stand body 121 according to the example of FIG. 9 further includes the opening 128 therethrough that serves as (part of) the second transmission path in the spark stand assembly 120 that allows for transmitting light emitted from the plasma generated in the plasma chamber 125b to the spectrometer assembly. In this regard, (a side of) the plasma chamber element 135 is provided with an aperture that is aligned with the opening 128 when the plasma chamber element 135 is duly installed into its position in the recess provided in the spark stand body 121, thereby allowing for the light emitted from the plasma generated in the plasma chamber 125b to enter the opening 128. Along the lines described in the foregoing with references to the example of FIGS. 3 and 5, the opening 128 through the spark stand body 121 may be closed by a transmission window 124 in order to isolate at least part of the opening from the plasma chamber 125b, thereby facilitating formation of a gas-tight enclosure within the plasma chamber 125b (upon further placing the sample under study to cover the opening 131 through the second end of the plasma chamber element 135). As described for the examples provided in the foregoing, in some examples the transmission window 124 may be replaced by a coupling lens.

At least a portion of the inner surface(s) of the plasma chamber element 135, i.e. the surface(s) that define the cavity therein, are provided with a coating layer 127, which may comprise a tribological coating made of material such as the DLC described in the foregoing. The coating layer 127 may be also provided on the bottom of the recess arranged in the spark stand body 121, e.g. such that the coating layer 127 covers the bottom of the recess in its entirety or such that the coating layer 127 covers the bottom of the recess apart from the insulator sleeve 126. Moreover, the coating layer 127 may further cover the surface(s) of the opening 128 from the recess to the transmission window 124 (or the coupling lens), i.e. the surface(s) of the first portion of the opening 128 between the plasma chamber 125b and the transmission window 124.

An arrangement according to the example of FIG. 9 allows for inserting the plasma chamber element 135 into the recess provided in the spark stand body 121 for carrying out the measurements and for removing the plasma chamber element 135 for cleaning the cavity defined within the plasma chamber element 135 and/or the recess arranged in the spark stand body 121. Along the lines described in the foregoing, such possibility to expose the surfaces of the plasma chamber 125b for cleaning may be especially advantageous in facilitating abrasive cleaning required to remove residuals of metals that are typically deposited on the surface(s) of the plasma chamber 125b over time in the course of measurements carried out.

Figure 10:
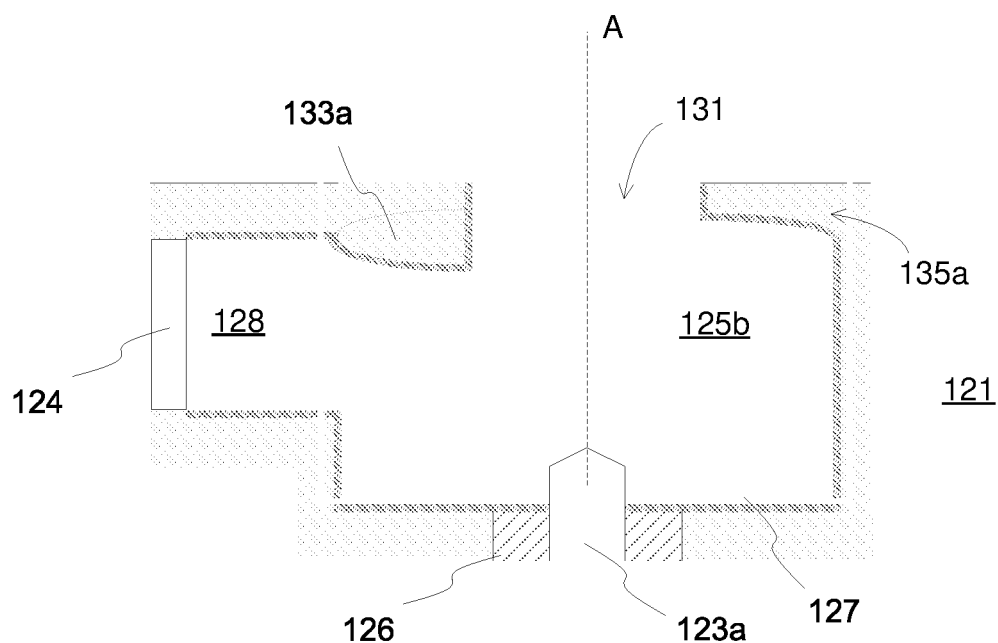
FIG. 10 schematically illustrates some aspects of a spark stand assembly according to an example.

FIG. 10 schematically illustrates a cross-section of the spark stand body 121 according to the example of FIG. 9 with a plasma chamber element 135a inserted into the recess provided in the spark stand body 121. Herein, a difference to the plasma chamber element 135 is that the plasma chamber element 135a is further provided with a masking portion 133a that protrudes from second end of the plasma chamber element 135a to the cavity defined within the plasma chamber element 135a such that it partially blocks the view from the spectrometer assembly 114 to the plasma cone generated in the plasma chamber 125b, the masking portion 133a thereby serving as a spatial mask that is applicable for obstructing the view to the hottest portion of the plasma cone generated in the plasma chamber 125b. In such an arrangement, the coating layer 127 may also cover at least a portion of the masking portion 133a.

Figure 11:
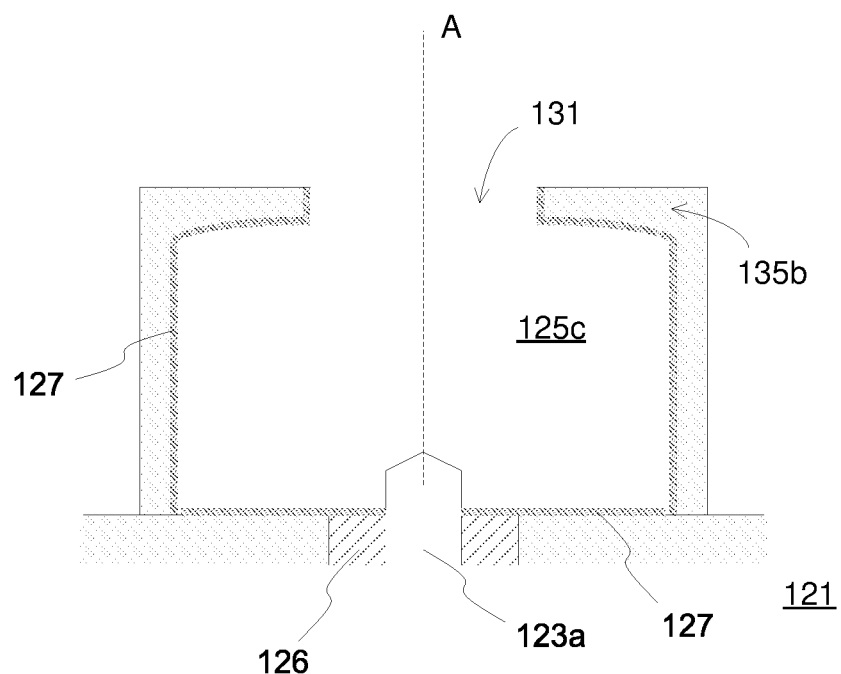
FIG. 11 schematically illustrates some aspects of a spark stand assembly according to an example.

FIG. 11 schematically illustrates a cross-section of the spark stand body 121 according to a further example, which may be considered as a variation of the spark stand body 121 according to the example of FIG. 9. In this example, the top surface of the spark stand body 121 is provided (substantially) without the recess and the electrode 123a and the insulator sleeve 126 may be arranged in the spark stand body 121 such that the 'upper' end of the sheath serving as the insulator sleeve 126 substantially forms part of the top surface. In this regard, an area on the top surface of the spark stand body 121 that surrounds the electrode 123a may serve as a mounting plane for receiving a plasma chamber element 135b. The plasma chamber element 135b defines a cavity therein, whereas a first end of the plasma chamber element 135b that is intended for facing the mounting plane may be substantially open and a second end that is opposite to its first end may be substantially closed but provided with an opening 131 therethrough to the cavity defined therein. Hence, according to an example, the cavity defined within the plasma chamber element 135b may have a shape of a bell or a(n inverted) cup with the opening 131 through its 'closed' end. A plasma chamber 125c may be formed via arranging the plasma chamber element 135b on top of the mounting plane.

The opening 131 through the second end of the plasma chamber element 135b enables exposing part of the surface of a sample arranged to cover the opening 131 for plasma generation upon activation of the electrode 123a. The opening 131 may be positioned in the second end of the plasma chamber element 135b such that it is spatially aligned with the electrode 123a (as described in the foregoing) when the plasma chamber element 135b is arranged into its position on the mounting plane. The top surface of the spark stand body 121 may be provided with a positioning pin or a positioning notch for guiding the plasma chamber element 135b into its correct position on the top surface. The plasma chamber element 135b may be detachably attachable on the top surface of the spark stand body 121 via usage of an attachment mechanism provided for holding the plasma chamber element 135b against the top surface, such as a set of clamps that enable securing the plasma chamber element 135b to the spark stand body 121 and releasing the plasma chamber element 135b from the spark stand body 121.

The plasma chamber 125c may further include an aperture that allows for the light emitted from the plasma generated in the plasma chamber 125c to exit the plasma chamber 125c (not shown in the illustration of FIG. 11), whereas the spark stand assembly 120 may further include an arrangement for optically coupling the aperture to the second transmission path. According to an example, said aperture may be provided in a side of the spark chamber element 135b, whereas according to another example said aperture may be provided through the mounting plane. Regardless of its position with respect to the plasma chamber 125c, the aperture that enables optical coupling from the plasma chamber 125 to the second transmission path may be closed by a transmission window or by a coupling lens in order to ensure a gas-tight enclosure within the plasma chamber 125c (upon further arranging the sample under study to cover the opening 131 through the second end of the plasma chamber element 135b).

At least a portion of the surface(s) of the plasma chamber 125c (apart from the transmission window that closes the aperture optically coupling the plasma chamber 125c to the second transmission path) may be provided with a coating layer 127, which may comprise a tribological coating made of material such as the DLC described in the foregoing. In this regard, the coating layer 127 may cover at least a portion of the inner surface(s) of the plasma chamber element 135b that define the cavity therein, whereas the coating layer 127 may be also provided on the mounting plane provided on the top surface of the spark stand body 121, e.g. such that the coating layer 127 covers the mounting plane substantially in its entirety or such that the coating layer 127 covers the mounting plane apart from the insulator sleeve 126.

In a variation of the example illustrated in FIG. 11, the plasma chamber element 135b may be further provided with a masking portion that protrudes from the surface of the cavity defined therein such that it partially blocks the view from the spectrometer assembly 114 to the plasma cone generated in the plasma chamber 125c and serves as a spatial mask that is applicable for obstructing the view to the hottest portion of the plasma cone generated in the plasma chamber 125c. In such an arrangement, the coating layer 127 may also cover at least a portion of the masking portion.

An advantage of the tribological coating (e.g. the amorphous carbon coating or the DLC coating provided via application of a deposition process such as the Plasmaimpax® process) provided by the coating layer 127 is its high wear resistance, which is typically significantly higher than that of the metals typically applied for constructing the spark stand body 121 and the spark stand plate 130, thereby providing enhanced durability against damage to the surface(s) of the plasma chamber 125 that may occur due to repeated abrasive cleaning applied to remove deposited contamination (such as residuals of metals deposited on the surface(s) of the plasma chamber 125 in the course of earlier measurements). Moreover, such coating layer 127 is elastic and heat-resistant, which facilitates durability of the coating layer 127 despite the high temperatures occurring in the plasma chamber in the course of measurements carried out by the OES instrument 100.

Another advantage of the tribological coating provided by the coating layer 127 is its low friction in comparison to that of the metals typically applied for constructing the spark stand body 121 and the spark stand plate 130, thereby reducing the amount of deposited contamination that typically accumulates on the surface(s) of the plasma chamber 125 in the course of measurements carried out by the OES instrument 100 while also facilitating removal of the debris possibly deposited to the surface(s) of the plasma chamber.

A further advantage of the tribological coating provided by the coating layer 127 is its low electrical conductivity in comparison to that of the metals typically applied for constructing the spark stand body 121 and the spark stand plate 130, thereby reducing the risk of arc-overs in the course of measurements carried out by the OES instrument 100.

A further advantage of the tribological coating provided by the coating layer 127 is its low reflectivity in comparison to that of the metals typically applied for constructing the spark stand body 121 and the spark stand plate 130. In this regard, the tribological coating has a dark, substantially black, color that is typically far less reflective than a polished metal surface of an uncoated plasma chamber. This may be a particular advantage in avoiding reflections from the hottest parts of the plasma cone 132 in arrangements where the spatial mask for obstructing the view to the hottest part of the plasma cone 132 is applied for improved detection performance.

The examples provided in the foregoing assume detachable mounting of the spark stand assembly 120 to the main housing 110 of the OES instrument 100 via detachably attaching the mounting flange to the mounting interface provided in the main housing 110. In other examples, the spark stand assembly 120 may be attached to the main housing 110 in a fixed manner, such that the correct spatial alignment between the second transmission path in the spark stand assembly 120 and the first transmission path in the main housing 110 is provided. In such a scenario the spark stand assembly 120 may be mounted via the mounting flange to the mounting interface of the main housing 110 as part of the manufacturing, installation or configuration process of the OES instrument 100, whereas subsequent dismounting of the spark stand assembly 120 by the user may not be provided for.

Moreover, alternatively or additionally, mounting of the spark stand assembly 120 to the main housing 110 of the OES instrument 100 may be different from that illustrated in the schematic illustration of FIG. 1, e.g. such that the spark stand assembly 120 is attached on top of the main housing 110. In further examples, the spark stand assembly 120 may be at least partially embedded and/or integrated into the main housing 110 of the OES instrument 100, thereby also encompassing a scenario where a portion of the main housing 110 of the OES instrument 100 (at least conceptually) serves as the spark stand assembly 120 according to the present disclosure. In a yet further example, the spark stand assembly 120 may not be mounted or mountable to the main housing 110 but the spark stand assembly 120 may be provided in a handheld probe element that is coupled to the main housing 110 via one or more cables (e.g. an 'umbilical') that provide the electrical and optical interfaces between the spark stand assembly 120 and the main housing 110. In this regard, the one or more cables may be flexible to allow for a user to move the handheld probe element with respect to the main housing 100 in order to bring it into a desired position for carrying out the measurement.

The examples provided in the foregoing describe certain aspects concerning structure and characteristics of the spark stand assembly 120 according to the present disclosure, while on the other hand the description omits many aspects of structure and/or operation that may be commonly applied for spark stands applied in context of OES instruments known in the art but that are not directly relevant for description of advantageous aspects of the spark stand assembly 120 according to the present disclosure. Examples of such aspects include gas inlet(s) to and draining outlet(s) from the plasma chamber 125, 125a and/or the groove 128a that may be provided to enable transferring the inert gas into the plasma chamber 125, 125a and out of the plasma chamber 125, 125a for creating the UV transmissive atmosphere within the plasma chamber 125, 125a and/or the groove 128a for carrying out the measurement, for purging of the plasma chamber 125, 125a and/or the groove 128a between measurements and/or for purging the portion of the sample 140 exposed via the opening 131 through the spark stand plate 130 upon carrying out the measurement. In this regard, the spark stand body 121 may be provided with one or more gas inlets for injecting inert gas (such as argon) into the plasma chamber 125, 125a for purging and one or more draining outlets for removing the inert gas and any debris formed during plasma generation out of the plasma chamber 125, 125a. Moreover, the spark stand assembly 120 may further comprise respective arrangements for injecting the inert gas via the one or more gas inlets into the plasma chamber 125, 125a and/or the groove 128a and for removing the inert gas and the debris via the one or more draining outlets from the plasma chamber 125, 125a and/or the groove 128a.

While the examples provided in the foregoing describe the structure and characteristics of the OES instrument 100 with at least implicit references to spark OES analysis, the examples provided in the present disclosure readily generalize into application in analysis instruments making use of a different OES technique, such as arc OES or laser-induced breakdown spectroscopy (LIBS), mutatis mutandis.

The invention claimed is:

1. A spark stand assembly for an optical emission spectroscopy (OES) instrument, the spark stand assembly comprising:
a spark stand body that at least partially defines a plasma chamber therein;
an exciter at least partially disposed inside the plasma chamber; and
an optical transmission path from the plasma chamber for providing a view to a plasma generated in the plasma chamber,
wherein the plasma chamber is provided with an opening for exposing a part of a sample positioned on the opening for excitation from the exciter so as to generate plasma on a surface of the sample upon activation of the exciter,
wherein a coating layer that comprises a tribological coating is arranged to cover at least a portion of surfaces of the plasma chamber; and
wherein said tribological coating comprises diamond-like carbon (DLC).

2. The spark stand assembly according to claim 1, wherein said coating layer is arranged to cover respective surfaces of the spark stand body that define the plasma chamber.

3. The spark stand assembly according to claim 1, wherein the exciter comprises an electrode that is partially enclosed within an insulator sleeve, wherein a portion of the insulator sleeve forms a portion of a surface of the plasma chamber and the electrode is arranged within the insulator sleeve such that a tip of the electrode is exposed to the plasma chamber and wherein the coating layer is arranged to cover said portion of the insulator sleeve.

4. The spark stand assembly according to claim 1, wherein the coating layer is further arranged to cover at least a portion of surfaces of the optical transmission path.

5. The spark stand assembly according to claim 1, wherein said optical transmission path comprises a coupling lens or a transmission window for isolating at least part of said optical transmission path from the plasma chamber and wherein the coating layer is arranged to cover at least a portion of surfaces of the optical transmission path between the plasma chamber and the coupling lens or a transmission window.

6. The spark stand assembly according to claim 1, wherein the plasma chamber is defined by a cavity arranged in the spark stand body and wherein the opening is provided through the spark stand body in a position that is substantially opposite to a portion of the exciter that is disposed inside the plasma chamber.

7. The spark stand assembly according to claim 1, wherein the plasma chamber is defined by a recess arranged in a top surface of the spark stand body and by a spark stand plate that is detachably attachable on the top surface of the spark stand body, wherein the opening is provided through the spark stand plate in a position that is spatially aligned with the exciter when the spark stand plate is attached on the top surface of the spark stand body.

8. The spark stand assembly according to claim 7, wherein the coating layer is arranged to cover a portion of a spark-stand-body-facing surface of the spark stand plate that forms a surface of the plasma chamber when the spark stand plate is attached on the top surface of the spark stand body.

9. The spark stand assembly according to claim 7, further comprising a groove arranged on the top surface of the spark stand body and extending from the recess arranged on the top surface of the spark stand body, the groove forming a part of the optical transmission path from the plasma chamber, wherein the coating layer is arranged to cover at least a portion of surfaces of the groove.

10. The spark stand assembly according to claim 9, wherein the coating layer is arranged to cover a portion of the spark-stand-body-facing surface of the spark stand plate that that covers the groove when the spark stand plate is attached on the top surface of the spark stand body.

11. The spark stand assembly according to claim 7, wherein the spark stand plate comprises a spatial mask that protrudes from the spark-stand-body-facing surface of the spark stand plate, arranged in a position that spatially coincides with the groove when the spark stand plate is attached on the top surface of the spark stand body, the spatial mask thereby partially obstructing said optical transmission path from the plasma chamber, wherein the coating layer is arranged to cover at least a portion of the spatial mask.

12. The spark stand assembly according to claim 1, wherein the plasma chamber is defined by a recess arranged in a top surface of the spark stand body and by a plasma chamber element that defines a cavity therein detachably inserted to said recess, wherein the plasma chamber element comprises a substantially open first end for facing a bottom of said recess and a substantially closed second end that is opposite to the first end and provided with the opening therethrough in a position that is spatially aligned with the exciter when the plasma chamber element is inserted into said recess and wherein the plasma chamber is defined by said cavity and the bottom of said recess when the plasma chamber element is inserted into said recess, and wherein the coating layer is arranged to cover at least a portion of the inner surface of said cavity and/or at least a portion of the bottom of said recess.

13. The spark stand assembly according to claim 1, wherein the plasma chamber is defined by a mounting plane provided on a top surface of the spark stand body and by a plasma chamber element that defines a cavity therein detachably attached on the mounting plane, wherein the plasma chamber element comprises a substantially open first end for facing the mounting plane and a substantially closed second end that is opposite to the first end and provided with the opening therethrough in a position that is spatially aligned with the exciter when the plasma chamber element is attached on the mounting plane and wherein the plasma chamber is defined by said cavity and the mounting plane when the plasma chamber element is attached on the mounting plane, and wherein the coating layer is arranged to cover at least a portion of the inner surface of said cavity and/or at least a portion of the mounting plane.

14. The spark stand assembly according to claim 13, wherein the plasma chamber element comprises a spatial mask protruding into said cavity and arranged to partially obstruct said optical transmission path from the plasma chamber, wherein the coating layer is arranged to cover at least a portion of the spatial mask.

15. An optical emission spectroscopy, OES, instrument comprising a main housing and a spark stand assembly according to claim 1, wherein the main housing comprises an optical spectrometer assembly coupled via an optical interface to said optical transmission path of the spark stand assembly.

16. The spark stand assembly according to claim 12, wherein the plasma chamber element comprises a spatial mask protruding into said cavity and arranged to partially obstruct said optical transmission path from the plasma chamber, wherein the coating layer is arranged to cover at least a portion of the spatial mask.

* * * * *